United States Patent
Lee et al.

(10) Patent No.: US 9,496,497 B2
(45) Date of Patent: Nov. 15, 2016

(54) METHOD FOR FORMING PATTERN ARRAYS AND ORGANIC DEVICES INCLUDING THE PATTERN ARRAYS

(75) Inventors: Sin-Doo Lee, Seouol (KR); Yu-Jin Na, Seoul (KR)

(73) Assignee: Samsung Display Co., Ltd. (KR)

( * ) Notice: Subject to any disclaimer, the term of this patent is extended or adjusted under 35 U.S.C. 154(b) by 1103 days.

(21) Appl. No.: 12/077,838

(22) Filed: Mar. 19, 2008

(65) Prior Publication Data

US 2009/0057657 A1   Mar. 5, 2009

(30) Foreign Application Priority Data

Sep. 5, 2007 (KR) .......................... 10-2007-0089959

(51) Int. Cl.
| | |
|---|---|
| *H01L 51/00* | (2006.01) |
| *B05D 1/32* | (2006.01) |
| *B05D 5/00* | (2006.01) |
| *B05D 5/08* | (2006.01) |
| *B05D 7/00* | (2006.01) |
| *H01L 27/32* | (2006.01) |

(52) U.S. Cl.
CPC ............ *H01L 51/0004* (2013.01); *B05D 1/32* (2013.01); *B05D 5/00* (2013.01); *B05D 5/08* (2013.01); *B05D 7/56* (2013.01); *H01L 27/3211* (2013.01); *Y02E 10/549* (2013.01); *Y10T 428/31504* (2015.04)

(58) Field of Classification Search
None
See application file for complete search history.

(56) References Cited

U.S. PATENT DOCUMENTS

| | | | | |
|---|---|---|---|---|
| 4,915,981 | A | * | 4/1990 | Traskos et al. ............. 219/121.7 |
| 5,466,926 | A | * | 11/1995 | Sasano et al. ....... G02B 3/0018 |
| | | | | 250/216 |
| 6,238,583 | B1 | * | 5/2001 | Edlinger et al. ................. 216/24 |
| 6,383,694 | B1 | * | 5/2002 | Wu et al. ........................... 430/7 |
| 2003/0129451 | A1 | * | 7/2003 | Nukada et al. ............... 428/690 |
| 2003/0222267 | A1 | * | 12/2003 | Kim et al. .......... H01L 27/3246 |
| | | | | 257/98 |
| 2003/0222842 | A1 | * | 12/2003 | Yuasa ..................... G02F 1/167 |
| | | | | 345/107 |
| 2004/0029382 | A1 | * | 2/2004 | Kawase ........................ 438/689 |
| 2004/0075788 | A1 | * | 4/2004 | Cheng ........................... 349/106 |
| 2004/0126678 | A1 | * | 7/2004 | Baek et al. ....................... 430/7 |

(Continued)

FOREIGN PATENT DOCUMENTS

| | | |
|---|---|---|
| JP | 9-49913 | 2/1997 |
| JP | 2002-164635 | 6/2002 |

(Continued)

OTHER PUBLICATIONS

Daintith, J., A Dictionary of Chemistry, 2008, Oxford University Press, Sixth Edition, pp. 514-515.*

(Continued)

*Primary Examiner* — Francisco Tschen

(74) *Attorney, Agent, or Firm* — Innovation Counsel LLP

(57) ABSTRACT

The present invention includes forming a hydrophobic thin film on a substrate, removing a portion of the first hydrophobic thin film to form a first hydrophilic region, coating a first organic solution on the substrate and selectively wetting the first hydrophilic region, drying the first organic solution to form a first organic thin film pattern in the first hydrophilic region, forming a second hydrophobic thin film on the first organic thin film pattern, coating a second organic solution and selectively wetting the second organic solution, and drying the second organic solution to form a second organic thin film pattern.

18 Claims, 13 Drawing Sheets
(4 of 13 Drawing Sheet(s) Filed in Color)

(56) References Cited

U.S. PATENT DOCUMENTS

| | | | |
|---|---|---|---|
| 2004/0227892 A1* | 11/2004 | Chen et al. | 349/143 |
| 2005/0158665 A1 | 7/2005 | Maekawa et al. | |
| 2006/0046062 A1* | 3/2006 | Nishigaki et al. | B29C 41/12 428/411.1 |
| 2006/0046163 A1* | 3/2006 | Broer et al. | 430/7 |
| 2006/0145365 A1* | 7/2006 | Halls et al. | 257/E51.022 |
| 2007/0063640 A1 | 3/2007 | Duineveld et al. | |
| 2007/0274871 A1* | 11/2007 | Jiang | 422/102 |

FOREIGN PATENT DOCUMENTS

| | | |
|---|---|---|
| JP | 2003-59940 | 2/2003 |
| JP | 2003-107230 | 4/2003 |
| JP | 2004-55177 | 2/2004 |
| JP | 2004-241758 | 8/2004 |
| JP | 2004-339331 | 12/2004 |
| JP | 2006-49803 | 2/2006 |
| JP | 2006-247581 | 9/2006 |
| JP | 2006-293148 | 10/2006 |
| KR | 10-2004-0040345 | 5/2005 |
| KR | 10-2005-0057353 | 6/2005 |
| KR | 10-2005-0075725 | 7/2005 |
| KR | 10-2005-0113117 | 12/2005 |
| KR | 10-2006-0038263 | 5/2006 |
| KR | 10-2006-0084736 | 7/2006 |
| KR | 10-2007-0004527 | 1/2007 |
| KR | 10-2007-0021081 | 2/2007 |
| KR | 10-2007-0032608 | 3/2007 |
| KR | 10-2007-0035702 | 4/2007 |
| KR | 10-2007-0071178 | 7/2007 |

OTHER PUBLICATIONS

Kaplan, S. Wiley Electrical and Electronics Engineering Dictionary, IEEE/Wiley, 2004, p. 195.*

Street et al., Jet printing flexible displays, Materials Today, Apr. 2006, vol. 9, No. 4 pp. 32-37.*

Patent Abstracts of Japan, Publication No. 09-049913, Feb. 18, 1997, 1 p.

Patent Abstracts of Japan, Publication No. 2002-164635, Jun. 7, 2002, 1 p.

Patent Abstracts of Japan, Publication No. 2003-059940, Feb. 28, 2003, 1 p.

Patent Abstracts of Japan, Publication No. 2003-107230, Apr. 9, 2003, 1 p.

Patent Abstracts of Japan, Publication No. 2004-055177. Feb. 19, 2004, 1 p.

Patent Abstracts of Japan, Publication No. 2004-339331, Dec. 2, 2004, 1 p.

Patent Abstracts of Japan, Publication No. 2006-049803, Feb. 16, 2006, 1 p.

Patent Abstracts of Japan, Publication No. 2006-247581, Sep. 21, 2006, 1 p.

Patent Abstracts of Japan, Publication No. 2006-293148, Oct. 26, 2006, 1 p.

Korean Patent Abstracts, Publication No. 1020040040345, May 12, 2004, 2 pp.

Korean Patent Abstracts, Publication No. 1020050057353, Jun. 16, 2005, 1 p.

Korean Patent Abstracts, Publication No. 1020050075725, Jul. 21, 2005, 1 p.

Korean Patent Abstracts, Publication No. 1020050113117, Dec. 1, 2005, 1 p.

Korean Patent Abstracts, Publication No. 1020060038263, May 3, 2006, 1 p.

Korean Patent Abstracts, Publication No. 1020060084736, Jul. 25, 2006, 2 pp.

Korean Patent Abstracts, Publication No. 1020070004527, Jan. 9, 2007, 1 p.

Korean Patent Abstracts, Publication No. 1020070021081, Feb. 22, 2007, 2 pp.

Korean Patent Abstracts, Publication No. 1020070032608, Mar. 22, 2007, 1 p.

Korean Patent Abstracts, Publication No. 1020070035702, Apr. 2, 2007, 1 p.

Korean Patent Abstracts, Publication No. 1020070071178, Jul. 4, 2007, 1 p.

* cited by examiner

METHOD FOR FORMING PATTERN ARRAYS AND ORGANIC DEVICES INCLUDING THE PATTERN ARRAYS

CROSS-REFERENCE TO RELATED APPLICATION

This application claims priority to and the benefit of Korean Patent Application No. 10-2007-0089959 filed in the Korean Intellectual Property Office on Sep. 5, 2007, the entire contents of which are incorporated herein by reference.

BACKGROUND OF THE INVENTION (a) Field of the Invention

The present invention is directed toward pattern arrays and an organic device including the pattern arrays.

(b) Description of the Related Art

An organic material has an easy composition of its material and good processibility to have desired physical/chemical and electrical/optical characteristics, so it has received much attention as an advantageous material for high performance and low cost electrical and optical devices.

Organic material thin films may be formed by a deposition process, and are widely used in the manufacture of organic light emitting devices and organic thin film transistors. However, because the deposition process requires a vacuum atmosphere, there are limits in forming thin films with large areas, and it is not suitable for realizing high resolution due to the use of shadow masks.

On the contrary, the formation process of thin films using an organic material solution includes a step of coating the organic material solution on the whole surface of a substrate such that organic thin films with a large area may be manufactured. However, when a method such as photolithography, ion beam deposition, or plasma etching is used to pattern the organic thin films, the organic thin films may be damaged thereby deteriorating the performance of the devices. Accordingly, a formation technique of organic thin films with a large area and a patterning technique for providing high resolution are simultaneously required.

Examples of the representative techniques are soft lithography, inkjet printing, laser-induced thermal imaging (LITI), etc.

However, soft lithography may not form pattern arrays on a substrate with large size due to deformation of a flexible mold, and inkjet printing needs an additional wall for defining the organic solution and it is difficult to match the compatibility between the organic solution and a printer nozzle such that forming patterns with high resolution is limited. Also, laser-induced thermal imaging may deteriorate the performance of the devices in the step of irradiating the laser on the organic thin films.

The above information disclosed in this Background section is only for enhancement of understanding of the background of the invention, and therefore it may contain information that does not form the prior art that is already known in this country to a person of ordinary skill in the art.

SUMMARY OF THE INVENTION

The present invention is to form fine pattern arrays with high resolution that are suitable for organic electrical and optical devices with a large area, having multi-functionality and high performance, through a thin film manufacturing process with a low cost and that is simplified.

A method for forming a pattern array according to an embodiment of the present invention includes forming a first hydrophobic thin film on a substrate, removing a portion of the first hydrophobic thin film to form a first hydrophilic region, coating a first organic solution on the substrate and selectively wetting the first hydrophilic region, drying the first organic solution to form a first organic thin film pattern in the first hydrophilic region, forming a second hydrophobic thin film on the first organic thin film pattern, coating a second organic solution and selectively wetting the second organic solution, and drying the second organic solution to form a second organic thin film pattern.

The method may further include removing a portion of the second hydrophobic thin film to form a second hydrophilic region after forming the second hydrophobic thin film, wherein the second organic solution may be selectively wetted on the second hydrophilic region.

The thickness of the first hydrophobic thin film and that of the second hydrophobic thin film may be more than about 10 nm and less than about 400 nm in one example, respectively.

The first organic thin film pattern and the second organic thin film pattern may be alternately disposed.

The first hydrophobic thin film may be dissolved and removed when forming the second hydrophobic thin film.

The forming of the first hydrophobic thin film may include coating a fluorine-containing polymer solution on the substrate, and the forming of the first hydrophilic region may include partially removing the fluorine from the first hydrophobic thin film.

The forming of the second hydrophobic thin film may include coating a fluorine-containing polymer solution on the first organic thin film pattern and the substrate, and the forming of the second hydrophilic region may include partially removing the fluorine from the second hydrophobic thin film.

The removal of the fluorine from first hydrophobic thin film and the second hydrophobic thin film may include aligning a mask on the first hydrophobic thin film or the second hydrophobic thin film and irradiating optical energy thereto.

The method may further include removing the second hydrophobic thin film after forming the second organic thin film pattern.

The thickness of the second hydrophobic thin film may be less than about 100 nm, and the second organic solution may be selectively wetted to overlap the first organic thin film pattern.

The first hydrophobic thin film may be dissolved and removed when forming the second hydrophobic thin film.

The first organic thin film pattern and the second organic thin film pattern may include a curable polymer material with dispersed pigments.

The first organic thin film pattern and the second organic thin film pattern may include a conjugated polymer.

The first organic thin film pattern and the second organic thin film pattern may have a convex shape.

The first organic thin film pattern and the second organic thin film pattern may have a flat surface at a central portion thereof.

A method for forming a pattern array according to another embodiment of the present invention includes forming the first hydrophobic thin film, removing a portion of the first hydrophobic thin film to form a first hydrophilic region, forming a first organic thin film pattern in the first hydrophilic region, forming a second hydrophobic thin film on the first organic thin film pattern and removing the first hydrophobic thin film, and selectively forming a second organic thin film pattern on the second hydrophobic thin film.

The first organic thin film pattern and the second organic thin film pattern may be formed by using wettability of an organic solution.

The thickness of the second hydrophobic thin film may be more than about 10 nm, and the method may further include removing a portion of the second thin film to form the second hydrophilic region after forming the second hydrophobic thin film, wherein the second organic thin film pattern may be formed in the second hydrophilic region.

At least one of removing the first hydrophobic thin film and removing the second hydrophobic thin film may include aligning a mask on the first hydrophobic thin film or the second hydrophobic thin film and irradiating optical energy thereto.

The thickness of the second hydrophobic thin film may be less than about 100 nm, and the second organic solution is selectively wetted to overlap the first organic thin film pattern.

An organic device according to an embodiment of the present invention includes the first and second thin film patterns.

The first and second organic thin film patterns may be one selected from a color filter, an organic emitting layer, an organic semiconductor, an organic photovoltaic device, and an organic semiconductor circuit.

According to an embodiment of the present invention, a unit process of forming an organic thin film pattern is repeated by using the wettability of a solution such that various patterns with a large area may be formed without an expensive etching process such as photolithography. Accordingly, the present invention prevents organic thin film patterns from being exposed to chemical solvents or plasma, thereby preventing damage thereto.

Furthermore, a complicated process such as photolithography, inkjet printing, or laser induced thermal imaging is not necessary, and a simple method such as dip coating, spin coating, and/or slit coating may form a plurality of patterns of different kinds, thereby remarkably reducing manufacturing cost and time.

Also, the previous hydrophobic thin film is removed when forming a hydrophobic thin film such that the surface characteristics are uniform even though the unit process is repeated several times, and accordingly the organic thin film patterns are uniform and stabilized. Accordingly, the unit process is repeated according to the necessity such that minute patterns having high resolution and of various kinds may be easily formed.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 15($b$) is a photograph showing a red filter and a green filter sequentially formed by a described unit process.

DETAILED DESCRIPTION OF THE EMBODIMENTS

Figure 1:
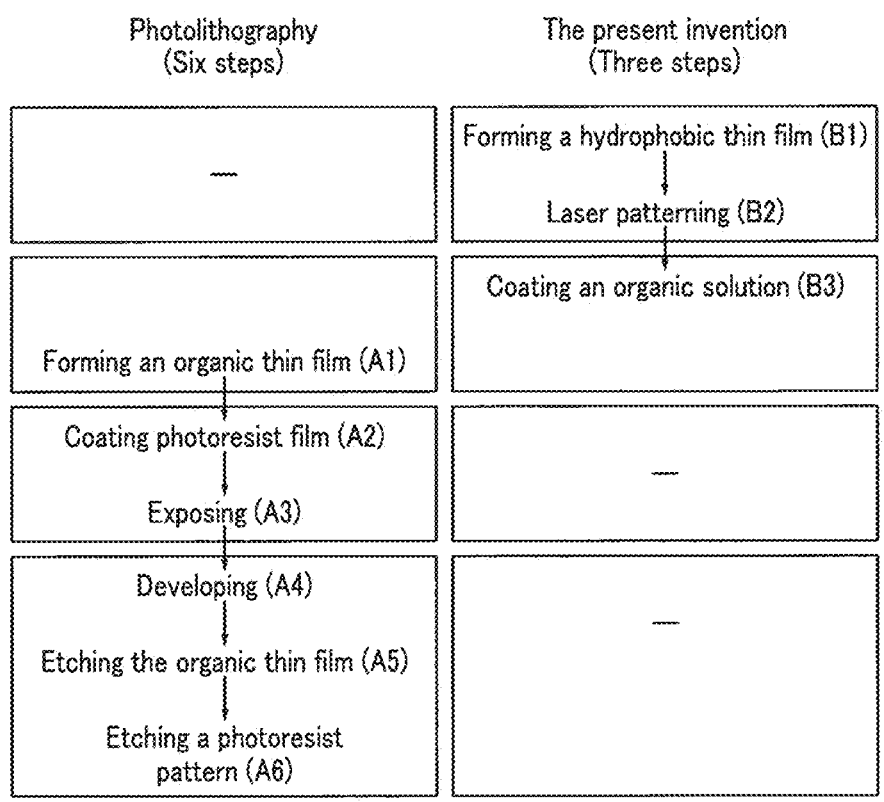
FIG. 1 is a flowchart comparing a method for forming pattern arrays according to an embodiment of the present invention with a method for forming pattern arrays using photolithography.

The present invention will be described more fully hereinafter with reference to the accompanying drawings, in which embodiments of the invention are shown. As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Now, a method for forming pattern arrays according to an embodiment of the present invention will be described in detail with reference to FIG. 1.

FIG. 1 is a flowchart comparing a method for forming pattern arrays according to an embodiment of the present invention with a method for forming pattern arrays using photolithography.

As shown in FIG. 1, a method for forming pattern arrays using conventional photolithography requires a total of six steps, whereas a method for forming pattern arrays according to an embodiment of the present invention only requires a total of three steps.

The method for forming pattern arrays using photolithography is as follows.

Firstly, an organic solution is coated on a surface to form an organic thin film (A1). Next, a photosensitive film is coated on the organic thin film (A2), and an etch mask is aligned thereon for exposure of a determined portion of the photosensitive film (A3). Then, the photosensitive film is developed to form a photosensitive pattern (A4), and the organic thin film is etched using the photosensitive pattern as a mask (A5). Next, the photosensitive pattern is removed to complete organic thin film patterns (A6).

On the other hand, a method for forming pattern arrays according to an embodiment of the present invention may be described as follows. Firstly, a hydrophobic solution such as a fluorine-containing polymer is coated on a substrate to form a hydrophobic thin film (B1). Next, a mask having an opening of a predetermined shape is aligned on the hydrophobic thin film, and light is irradiated thereon using an optical device such as a KrF excimer laser as an example to remove a portion of the hydrophobic thin film (B2). The portion where the hydrophobic thin film is removed has a hydrophilic property. Next, an organic solution is coated on the whole surface of the substrate (B3). Here, only the organic solution having a hydrophilic property remains on the hydrophilic portion where the hydrophobic thin film is removed by the wetness of the solution such that organic thin film patterns are spontaneously formed.

In the method for forming the patterns according to an embodiment of the present invention, the thin film patterns may be formed by using the wetness of the solution without an additional etch step, thereby simplifying the manufacturing process compared with the method using conventional photolithography. The above-described three steps indicate a unit process for forming patterns of the same kind.

On the other hand, a method for forming pattern arrays according to an embodiment of the present invention may form a plurality of patterns of different kinds by repeating the unit process. Regarding a plurality of patterns that are sequentially formed, a color filter panel as one example will be described.

Figure 2:
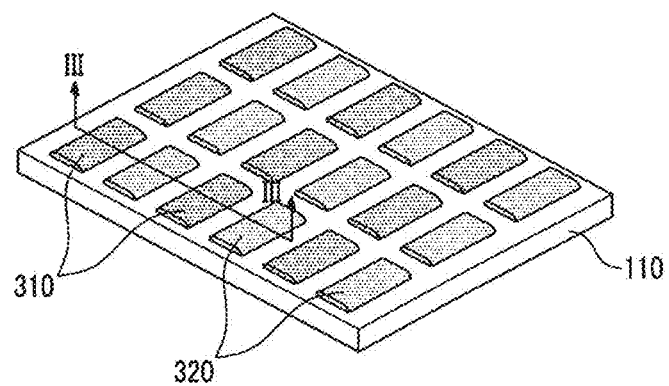
FIG. 2 is a perspective view of a color filter panel formed by the method according to an embodiment of the present invention.
Figure 3:
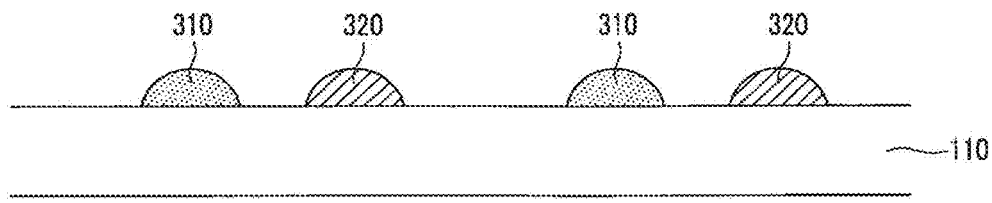
FIG. 3 is a cross-sectional view of the color filter panel shown in FIG. 2 taken along the line III-III.

FIG. 2 is a perspective view of a color filter panel manufactured by the method according to an embodiment of the present invention, and FIG. 3 is a cross-sectional view of the color filter panel shown in FIG. 2 taken along the line III-III.

As shown in FIG. 2 and FIG. 3, a color filter panel according to an embodiment of the present invention includes a plurality of pattern arrays, for example a plurality of red filters 310 and a plurality of green filters 320, formed on a substrate 110. The red filters 310 and the green filters 320 are alternately arranged with a predetermined interval therebetween, according to row. The red filters 310 and the green filters 320 directly contact the substrate 110, and their central portions have a convex hemispherical shape.

The method for forming the red filters 310 and the green filters 320 will be described in detail with reference to FIG. 4 to FIG. 14.

Figure 4:
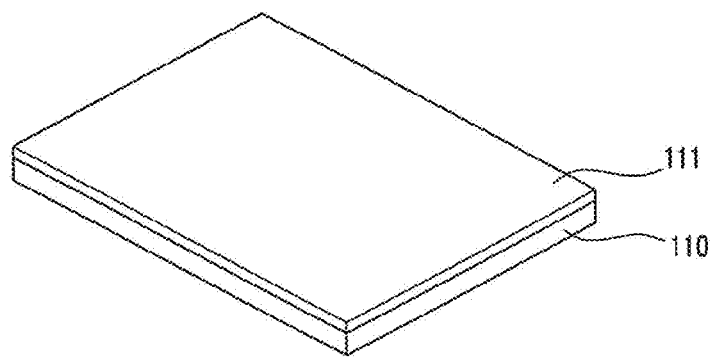
FIG. 4, FIG. 7, FIG. 9, FIG. 10, and FIG. 13 are perspective views sequentially showing processes of manufacturing the color filter panel shown in FIG. 2 and FIG. 3 according to an embodiment of the present invention.
Figure 5:
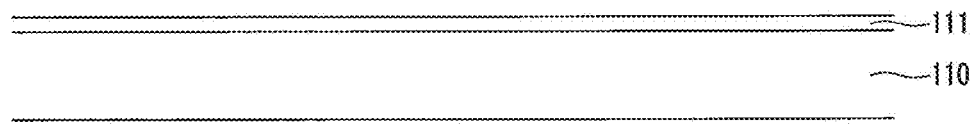
FIG. 5 is a cross-sectional view of the color filter panel shown in FIG. 4 taken along the line V-V.
Figure 6:
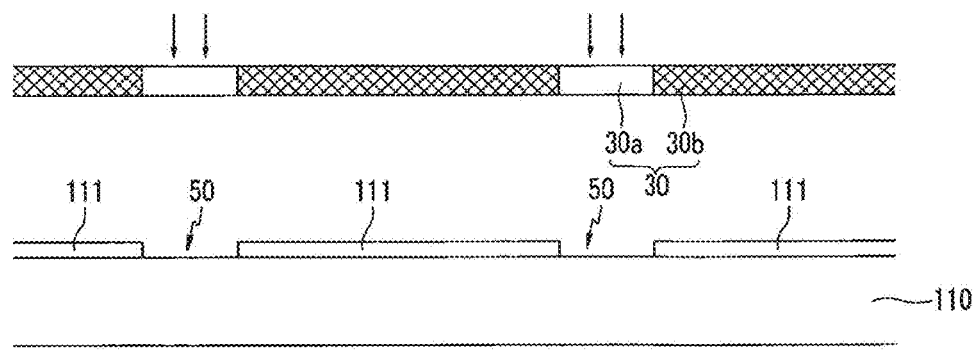
FIG. 6 is a cross-sectional view showing the following step of the color filter panel shown in FIG. 4 and FIG. 5.
Figure 7:
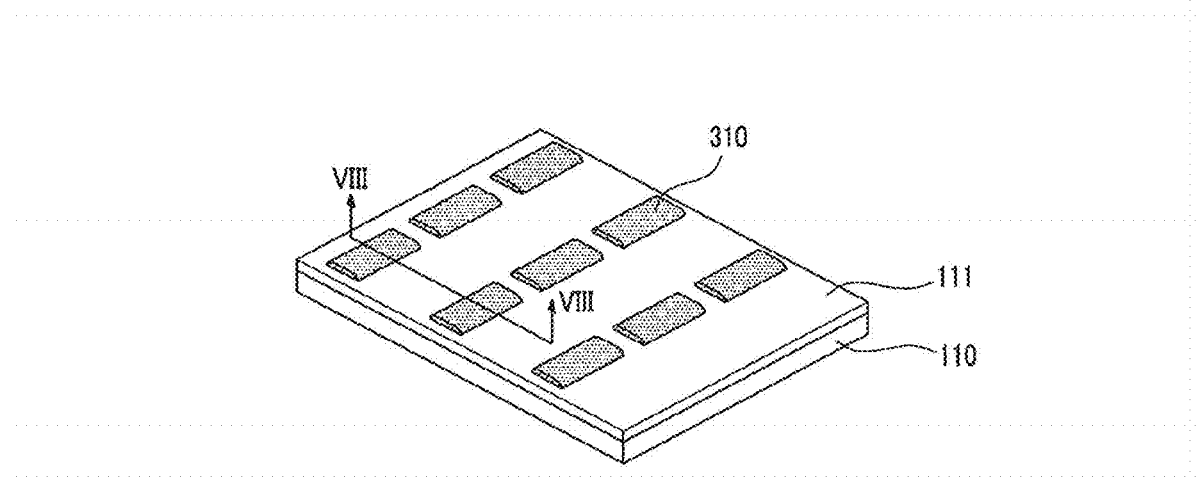
Figure 8:
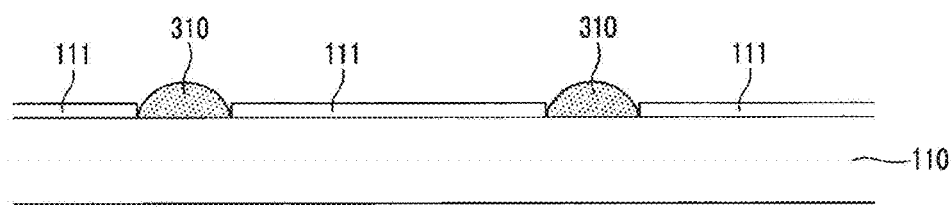
FIG. 8 is a cross-sectional view of the color filter panel shown in FIG. 7 taken along the line VIII-VIII.
Figure 9:
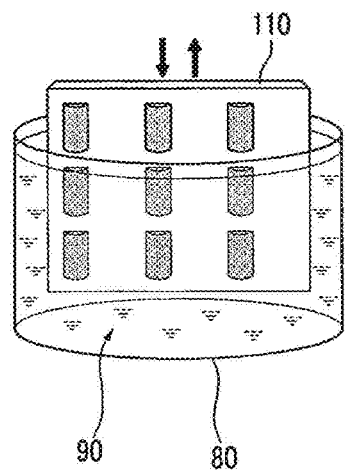
Figure 10:
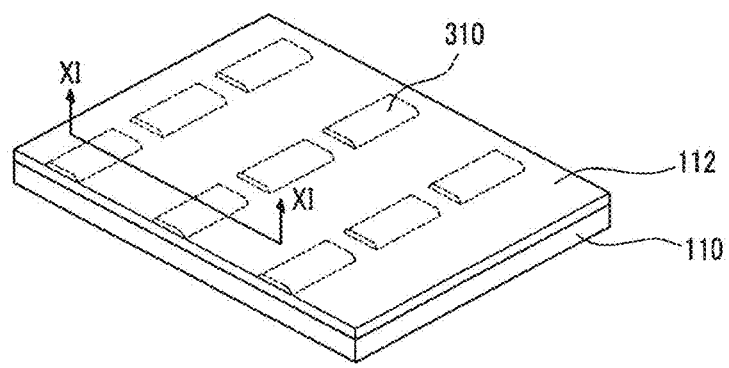
Figure 11:
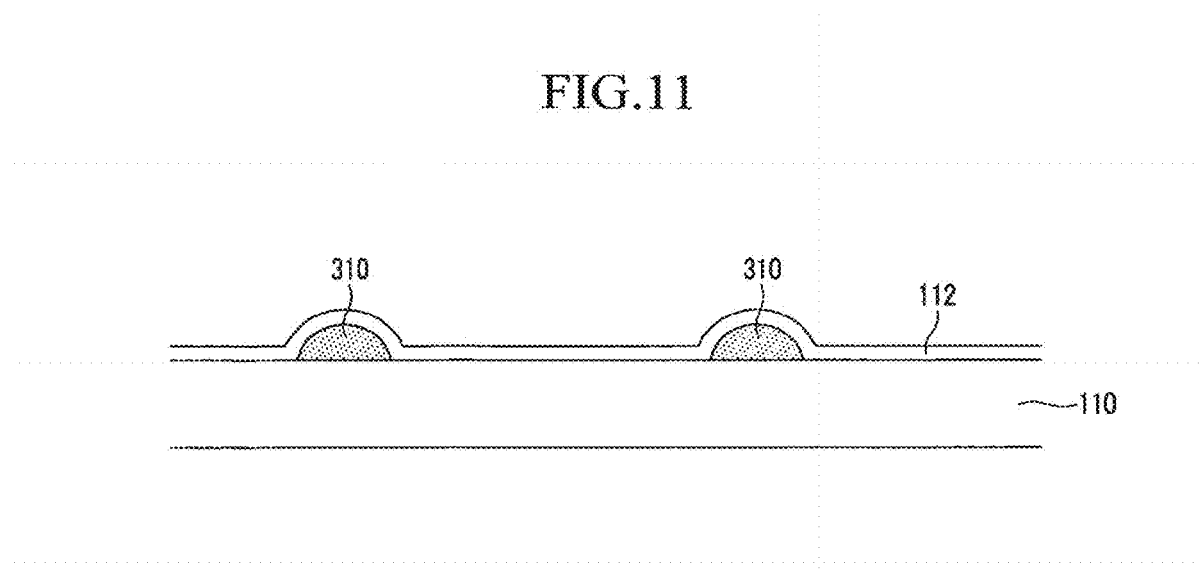
FIG. 11 is a cross-sectional view of the color filter panel shown in FIG. 10 taken along the line XI-XI.
Figure 12:
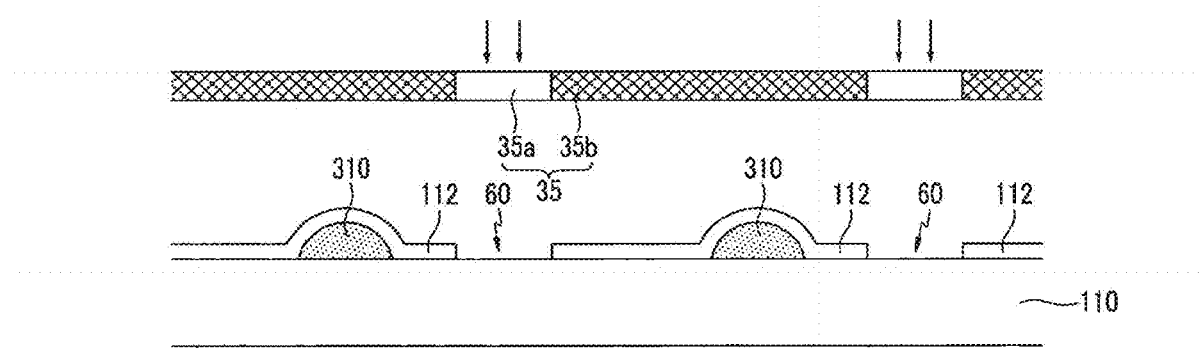
FIG. 12 is a cross-sectional view showing the following step of the color filter panel shown in FIG. 10 and FIG. 11.
Figure 13:
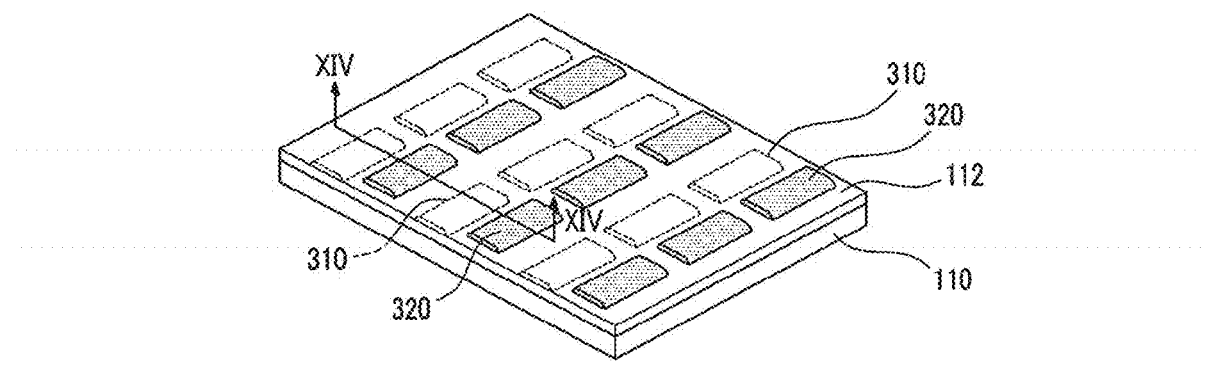
Figure 14:
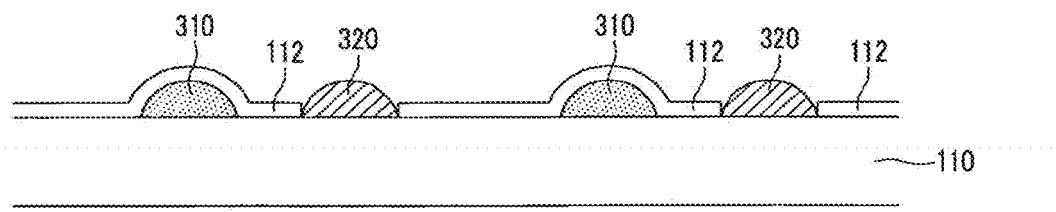
FIG. 14 is a cross-sectional view of the color filter panel shown in FIG. 13 taken along the line XIV-XIV.

FIG. 4, FIG. 7, FIG. 9, FIG. 10, and FIG. 13 are perspective views sequentially showing processes of manufacturing the color filter panel shown in FIG. 2 and FIG. 3 according to an embodiment of the present invention, FIG. 5 is a cross-sectional view of the color filter panel shown in FIG. 4 taken along the line V-V, FIG. 6 is a cross-sectional view showing the following step of the color filter panel shown in FIG. 4 and FIG. 5, FIG. 8 is a cross-sectional view of the color filter panel shown in FIG. 7 taken along the line VIII-VIII, FIG. 11 is a cross-sectional view of the color filter panel shown in FIG. 10 taken along the line XI-XI, FIG. 12 a cross-sectional view showing the following step of the color filter panel shown in FIG. 10 and FIG. 11, and FIG. 14 is a cross-sectional view of the color filter panel shown in FIG. 13 taken along the line XIV-XIV.

Referring to FIG. 4 and FIG. 5, a first hydrophobic thin film 111 is formed on a substrate 110 that is preferably made of glass or plastic. The lower hydrophobic thin film 111 may be formed by coating a fluorine-containing polymer solution, and the fluorine-containing polymer solution may be formed by dissolving a fluorine-containing compound in a fluorinated solvent having a relatively low boiling temperature. The first hydrophobic thin film 111 is coated on the whole surface of the substrate 110 by using at least one method selected from spin coating, dip coating, and slit coating. The first hydrophobic thin film 111 may have a thickness of about 10 nm to 400 nm, and is more preferably about 40 to 200 nm, in one example.

Referring to FIG. 6, a mask 30 including a light transmitting region 30a and a light blocking region 30b is disposed on the first hydrophobic thin film 111, and light is irradiated thereon by using an optical device such as a laser. The laser is not particularly limited, but may be a KrF excimer laser with a wavelength of about 248 nm as an example.

The light irradiated from the laser transmits through the light transmitting region 30a of the mask 30, and ablates the fluorine in the predetermined region of the first hydrophobic thin film 111. Here, a plasma process instead of the laser may be used for the ablation of the fluorine from the predetermined region of the first hydrophobic thin film 111. In the drawing, the region where the fluorine is ablated in the first hydrophobic thin film 111 is indicated as hydrophilic regions 50.

Next, a curable organic solution for a red filter is coated on the whole surface of the first hydrophobic thin film 111. The curable organic solution may include monomers, fluorescent pigments, and organic solvents, and has a hydrophilic property. The curable organic solution may be coated by using spin coating or slit coating. Because the curable organic solution includes a different surface characteristic from the first hydrophobic thin film 111, the curable organic solution is only wetted on the hydrophilic regions 50.

Next, as shown in FIG. 7 and FIG. 8, the curable organic solution is cured by using heat or light to form a plurality of red filters 310 in the hydrophilic regions 50. The red filters 310 have a different surface characteristic from the first hydrophobic thin film 111 enclosing the hydrophilic regions 50 such that the central portions of the red filters 310 are thick and the edge portions of the red filters 310 are thin, thereby having a convex hemispherical shape.

Figure 21:
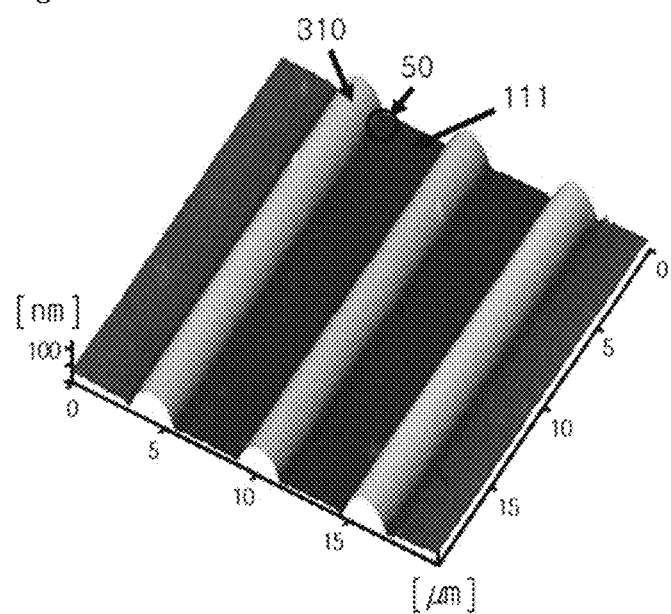
FIG. 21 is a photograph showing the color filters observed with an atomic force microscope (AFM).

FIG. 21 is a photograph showing the color filters observed by an atomic force microscope (AFM) and formed by the above-described method.

Here, the organic solution for the color filters includes 65-UV adhesive goods of the Norland Corporation, and the hydrophobic solution includes goods on the market from the 3M Corporation.

As shown in FIG. 21, a color filter panel includes a first hydrophobic thin film 111, a hydrophilic region 50, and color filters 310 having a hemispherical shape and formed in the hydrophilic region 50. Here, the color filters 310 have a width of about 2 μm and a height of about 100 nm with high resolution, which are substantially of the same degree as those manufactured by a photolithography process.

In this embodiment of the present invention, the wettability of the solution that allows the hydrophilic solution to remain in the hydrophilic region is used to form a plurality of color filters without an etching process such as via expensive photolithography.

Next, a method of forming a plurality of green filters neighboring the red filters will be described in detail. The green filters may be formed by repeatedly executing the above-mentioned unit process.

Referring to FIG. 9, the substrate 110 including the first hydrophobic thin film 111 and the red filters 310 is immersed in a solution tank 80 containing a hydrophobic solution 90 in a dip coating method. Here, the hydrophobic solution 90 may be a fluorine-containing polymer solution, and the fluorine-containing polymer solution may be manufactured by dissolving a fluorine-containing compound in a fluorinated solvent having a relatively low boiling temperature, as an example. Alternatively, spin coating or slit coating may be used instead of dip coating.

In this dip coating step, because the first hydrophobic thin film 111 is dissolved in the hydrophobic solution 90, the first hydrophobic thin film 111 is removed and the hydrophobic solution 90 having the same surface property is coated thereon.

Next, the substrate 110 is extracted from the hydrophobic solution 90 and the solvent is dried to form a second hydrophobic thin film 112, as shown in FIG. 10 and FIG. 11. It is preferable that the second hydrophobic thin film 112 have a thickness of about 10 nm to 400 nm in one example. When the second hydrophobic thin film 112 is extremely thin, a Van der Waals interaction may be generated between the red filter 310 disposed under the second hydrophobic thin film 112 and an organic solution for a color filter that is coated on the second hydrophobic thin film 112 in a following process such that the organic solution for the other color filter may be absorbed on the red filters 310. In this case, because the organic solution for the other color filter may remain on the red filters 310, spots may be visible.

The thickness of the second hydrophobic thin film 112 may be controlled by the concentration of the hydrophobic solution 90 and the speed of the dip coating. For example, the thickness of the second hydrophobic thin film 112 is about 40 nm in the case of a concentration of about 2% and a speed of about 85 mm/minute, and the thickness of the second hydrophobic thin film 112 is about 80 nm in the case of a concentration of about 2.5% and a speed of about 85 mm/minute. Here, a method for coating the whole surface of the substrate such as spin coating or slit coating may be used instead of dip coating.

Next, referring to FIG. 12, a mask 35 including a light transmitting region 35a and a light blocking region 35b is disposed on the second hydrophobic thin film 112, and light is irradiated thereon by using an optical device such as a laser. Here, the transmitting light region 35a does not overlap the red filters 310. The laser is not particularly limited, but may be a KrF excimer laser with a wavelength of about 248 nm as an example.

The light irradiated from the laser transmits through the light transmitting region 35a of the mask 35, and may ablate the fluorine in the predetermined region of the second hydrophobic thin film 112. A plasma process instead of the laser may be used for the ablation of the fluorine from the predetermined region of the second hydrophobic thin film 112. In the drawing, the region where the fluorine is ablated in the second hydrophobic thin film 112 is indicated as hydrophilic regions 60.

Next, a curable organic solution for a green filter is coated on the whole surface of the second hydrophobic thin film 112. The curable organic solution may include monomers, fluorescent pigments, and organic solvents, and has a hydrophilic property. The curable organic solution may be formed by using spin coating, dip coating, or slit coating, and the thickness of the layer and the shape of the pattern may be changed according to the coating speed. Because the curable organic solution includes a different surface property from the second hydrophobic thin film 112, the curable organic solution is only wetted on the hydrophilic regions 60. Next, as shown in FIG. 13 and FIG. 14, the curable organic solution is polymerized and dried by using heat or light to form a plurality of green filters 320 in the hydrophilic regions 60. The green filters 320 have a different surface property from the second hydrophobic thin film 112 enclosing the hydrophilic regions 60 such that the central portions of the green filters 320 are thick and the edge portions of the green filters 320 are thin, thereby having a convex hemispherical shape.

Next, referring to FIG. 2 and FIG. 3, the second hydrophobic thin film 112 is removed by using the method of FIG. 9 to leave the red filters 310 and the green filters 320.

Figure 15:
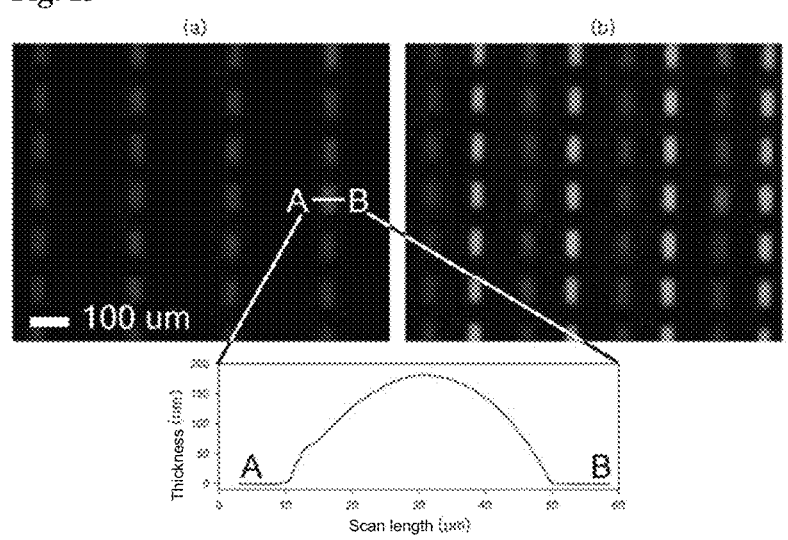
FIG. 15($a$) is a photograph showing a red filter formed by a described unit process.

FIG. 15(a) is a photograph showing a red filter formed by an above-described unit process, and FIG. 15(b) is a photograph showing a red filter and a green filter sequentially formed by an above-described unit process.

The graph of FIG. 15(a) shows the cross-sectional view A-B of red filters 310 by using alpha step equipment, and the red filters 310 of which the center are convex hemispherical. It is difficult to form this hemispherical shape through conventional photolithography, inkjet printing, and laser induced thermal imaging, and the hemispherical shape generates a microlens effect of condensing the light passing through the color filter, thereby improving light efficiency Here, the red filters 310 and the green filters 320 are described, but blue filters (not shown) or other color filters may be further formed on the positions neighboring the red filters 310 and the green filters 320 by repeating the above unit process.

In this embodiment of the present invention, the unit process is such that the hydrophobic thin film and the hydrophilic organic solution are sequentially coated and the organic thin film pattern is formed by using the wetness of the solution. The unit process is repeatedly executed to form the various patterns without an expensive etching process. Accordingly, the organic thin film patterns are not exposed to a chemical solvent or plasma used in the etching process, thereby preventing the organic thin film patterns from damaging.

Furthermore, the manufacturing process is not complicated and expensive equipment is not needed in the embodiment of the present invention as it is for inkjet printing and LITI, and different and various patterns may be formed by using the simple coating method such as dip coating, spin coating, and/or slit coating, thereby remarkably reducing manufacturing cost and time. This simple coating method is advantageous for forming fine patterns with high resolution in a large area. Also, the method may be easily suitable for a large area without the problem generated by the incompatibility between a print head and a solution in an inkjet printing method.

Furthermore, when the second hydrophobic thin film is formed, the first hydrophobic thin film is removed in the embodiment of the present invention. Accordingly, though several unit processes are repeated, the same surface property may be maintained to thereby obtain stability and uniformity of the organic thin film. Accordingly, the unit process may be repeated to form various patterns of different kinds.

Now, a color filter panel including a plurality of patterns according to another embodiment of the present invention will be described in detail.

Figure 16:
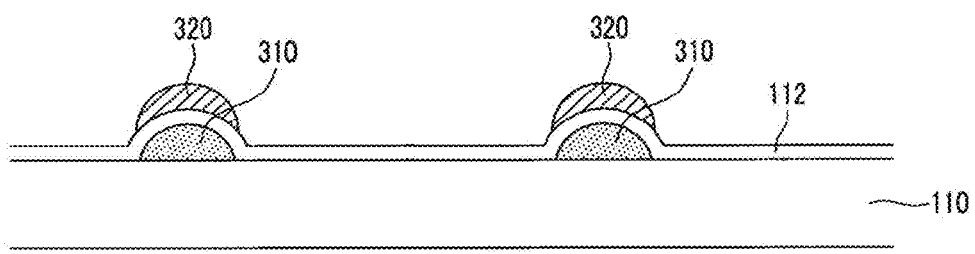
FIG. 16 is a cross-sectional view of a color filter panel including a plurality of patterns according to another embodiment of the present invention.

FIG. 16 is a cross-sectional view of a color filter panel including a plurality of patterns according to another embodiment of the present invention.

The present embodiment is almost the same as the previous embodiment, but the red filters 310 and the green filters 320 overlap each other. Referring to FIG. 16, a color filter panel according to the present embodiment includes a substrate 110, and a plurality of pattern arrays are formed on the substrate 110. The pattern arrays include a plurality of red filters 310 and a plurality of green filters 320 overlapping each other via a second hydrophobic thin film 112.

A method for forming the red filters 310 and the green filters 320 is similar to the above-described embodiment, and will be described in detail with reference to FIG. 4 to FIG. 14.

Like the previous embodiment, a first hydrophobic thin film 111 is formed on a substrate 110, a mask 30 is aligned on the first hydrophobic thin film 111, and light is irradiated thereon to form a plurality of hydrophilic regions 50. Next, a curable organic solution having hydrophilic properties is coated to wet the hydrophilic regions 50, and the curable organic solution is cured by using heat or light to form a plurality of red filters 310.

Next, dip coating by immersing the substrate 110 in a hydrophobic solution 90 is executed, and the first hydrophobic thin film 111 having the same surface property as the hydrophobic solution 90 is removed and a second hydrophobic thin film 112 is formed. Here, the second hydrophobic thin film 112 has a thickness up to about 100 nm, different from the previous embodiment.

Next, an organic solution for a green filter is coated on the second hydrophobic thin film 112. Different from the previous embodiment, when the second hydrophobic thin film 112 has a thickness up to about 100 nm, Van der Waals interaction is generated between the red filter 310 disposed under the second hydrophobic thin film 112 and the organic solution for the green color filter such that the organic solution of the green color filter is absorbed only on the red filters 310. Next, as shown in FIG. 16, the absorbed organic solution is polarized and dried by the heat or the light to form a plurality of green filters 320 only disposed on the red filters 310.

As described above, the thickness of the second hydrophobic thin film may be controlled to operate a Van der Waals interaction to the hydrophobic thin film such that different patterns are formed to overlap each other without additional processes. As described above, a plurality of patterns displaying different colors are formed to overlap each other such that the patterns may display a mixed color, thereby displaying various colors.

In the above-described embodiments, methods for forming color filters in a color filter panel are explained, but these are not limiting, and the methods may be adapted to forming various organic devices and optical devices including pattern arrays.

Another embodiment of the present invention is an organic light emitting diode (OLED) display. In the OLED, electrons injected from one of two electrodes and holes injected from the other electrode are combined inside the organic emitting layer formed therebetween to form excitons. The excitons release energy, that is, they emit light.

Here, the organic emitting layer includes a conjugated polymer, and may include pattern arrays in which emitting layers of red, green, and blue are alternately arranged to display full colors.

These pattern arrays may be formed using an emittable conjugated polymer instead of a curable polymer for the color filter of the above-described embodiment, and three unit processes for forming a red emitting layer, a green emitting layer, and a blue emitting layer may be repeated.

Figure 17:
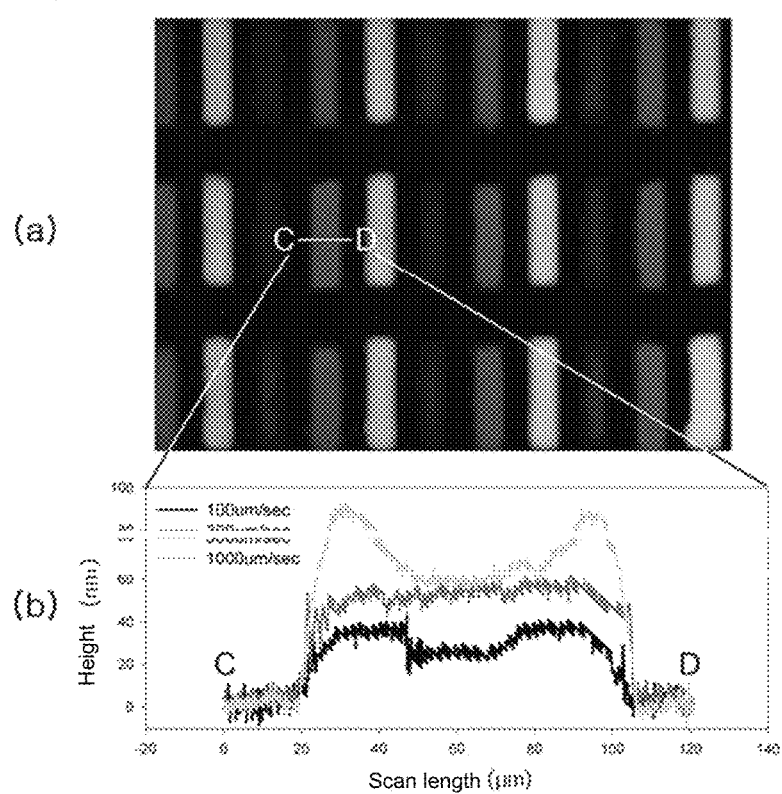
FIG. 17 is a photograph observed by an optical microscope and showing red emitting layers, green emitting layers, and blue emitting layers alternately arranged in an OLED display.

FIG. 17 is a photograph observed by an optical microscope and showing a red emitting layer, a green emitting layer, and a blue emitting layer alternately arranged in an OLED display.

Here, emitting layers are formed using organic solutions in which emittable materials of red, green, and blue marketed by the Dow Corning Corporation are dissolved in a xylene solvent from the Sigma-Aldrich Corporation, and the concentration of each solution is about 2.5%.

The graph shows the cross-sectional view C-D of one emitting layer observed by alpha step equipment, and the central portion is flat, different from the color filter. This is caused by a complete wetting effect of the solution, and since the energy of wetting the organic solution to the substrate is larger than the surface tension, the central portion is not convex but has a flat pancake shape.

In the OLED display, because the current density is changed according to the thickness of the thin film, the flat pancake shape is advantageous for improving the performance of the device compared with the convex hemispherical shape. It is difficult to form the flat pancake shape by prior photolithography methods or inkjet methods, but it is easy in the method according to an embodiment of the present invention, by controlling the coating speed of the organic solution, etc.

Also, as shown in the graph, the height and the shape of the emitting layer are changed according to the coating speed of the organic solution, and when comparing the cases of forming with the coating speeds of about 100 µm/sec, 300 µm/sec, and 1000 µm/sec, the thickness is least at a speed of about 100 µm/sec, and both edges are thicker and the central portion is flat at a speed of about 1000 µm/sec. That is, the coating speed of the solution may be appropriately controlled to form patterns having the desired thickness.

Figure 18:
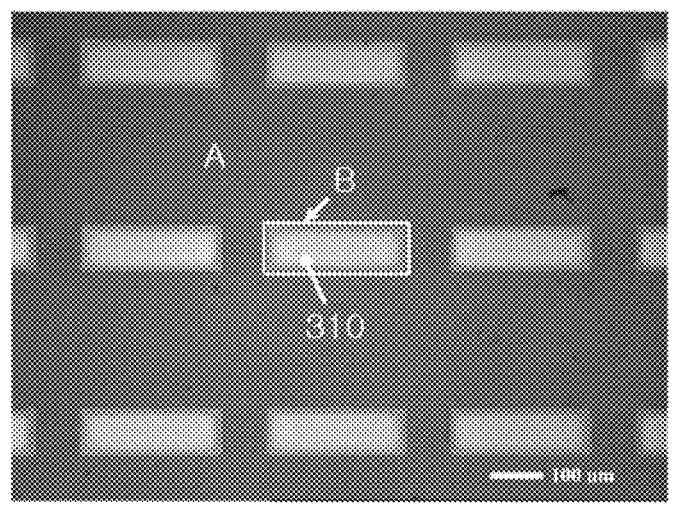
FIG. 18 is a photograph showing a plurality of pattern arrays in an OLED display according to an embodiment of the present invention.

FIG. 18 is a photograph showing pattern arrays of an OLED display according to an embodiment of the present invention. Here, the pattern arrays are made of fine patterns having a width of about 300 µm and a length of about 100 µm, which is the size of pixels of the commonly used OLED display.

On the other hand, the OLED display may include an emitting layer in which at least two emitting layers are overlapped to emit different colors. For example, when a red emitting layer and a green emitting layer are overlapped, the mixed color of red and green may be emitted; when a green emitting layer and a blue emitting layer are overlapped, the mixed color of green and blue may be emitted; and when a red emitting layer, a green emitting layer, and a blue emitting layer are overlapped, white light may be emitted. As described above, a plurality of emitting layers that emit different colors may be overlapped to emit various colors.

Figure 19:
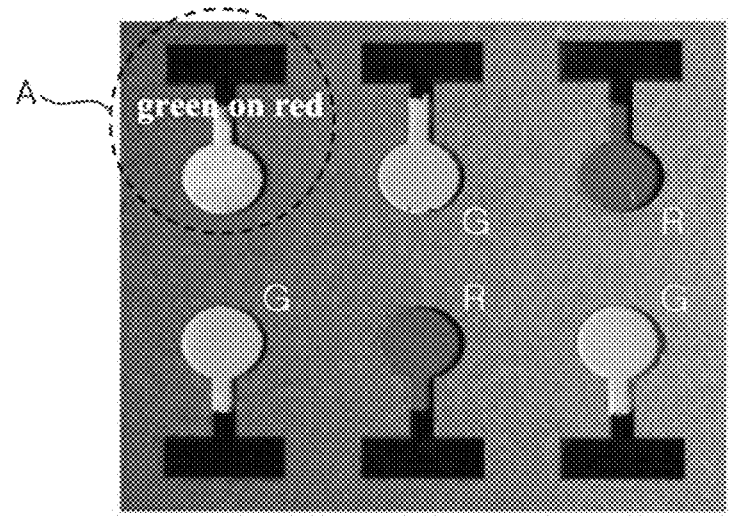
FIG. 19 is a photograph showing of a plurality of emitting layers according to another embodiment of the present invention.

FIG. 19 is a photograph showing a plurality of emitting layers according to another embodiment of the present invention. Here, "A" is a case in which a red emitting layer and a green emitting layer are overlapped via a hydrophobic thin film, and an orange color as their mixed color is emitted. This is different from a region R in which only a red emitting layer is formed and a region G in which only a green emitting layer is formed.

Figure 20:
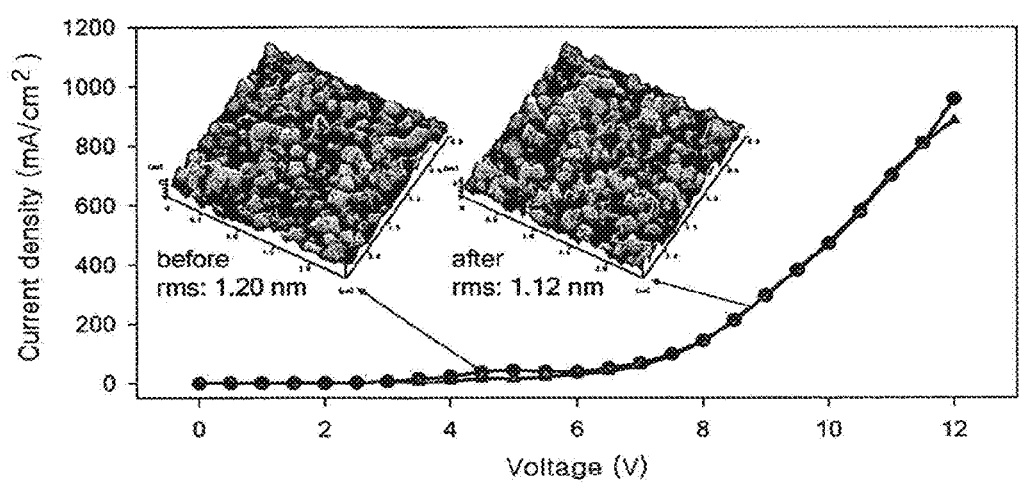
FIG. 20 is a graph showing a change of current density according to voltages when repeating the removing of hydrophobic thin films and the forming of new hydrophobic thin films according to an embodiment of the present invention.

FIG. 20 is a graph showing a change of current density according to voltages when repeating the removing of hydrophobic thin films and the forming of new hydrophobic thin films according to an embodiment of the present invention.

As shown in the graph, the current density in the case that a hydrophobic thin film is formed (before) and the current density in the case that a hydrophobic thin film is removed and a new hydrophobic thin film is formed three times (after) are almost the same. Also, the surface roughnesses of the display panels are almost same, having a rms (root-mean-square) of about 1.20 nm and about 1.12 nm before and after, respectively.

Accordingly, although the first hydrophobic thin film is removed and the new hydrophobic thin film is formed by repeating the unit process several times, the physical, chemical, and electrical characteristics of the patterns are hardly changed. This is because the organic thin films such as the color filter and the organic emitting layer hardly include halogen compounds that are not usually reacted with a fluorinated hydrophobic solution.

Although the color filters and the organic emitting layers as fine patterns has been described in detail hereinabove, the present invention may be adaptable to an organic semiconductor, a nanoparticle, and a soluble monomer in a like manner. The organic semiconductor includes a conjugated polymer as the organic emitting layer in the OLED display, and may be formed using the above unit process.

Furthermore, the present invention may be adaptable to various organic electrical devices and optical devices such as an organic photovoltaic device and an organic semiconductor circuit including pattern arrays.

While this invention has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

What is claimed is:

1. A method for forming a pattern array, the method comprising:
   forming a first hydrophobic thin film on a substrate;
   removing a portion of the first hydrophobic thin film to form a first hydrophilic region and a first hydrophobic region;
   coating a first organic solution onto the surface of the substrate including on the first hydrophilic region and the first hydrophobic region, and selectively wetting the first hydrophilic region with the first organic solution without wetting the first hydrophobic thin film in the first hydrophobic region;
   drying the first organic solution to form a first organic thin film pattern in the first hydrophilic region without etching, wherein the first organic thin film pattern has a hemispherical shape;
   forming a second hydrophobic thin film on the first organic thin film pattern, the second hydrophobic thin film covering side surfaces and a top surface of the first organic thin film pattern;
   removing a portion of the second hydrophobic thin film to form a second hydrophilic region and a second hydrophobic region;
   coating a second organic solution onto the surface of the substrate including on the second hydrophilic region and on the second hydrophobic region, and selectively wetting the second hydrophilic region with the second organic solution without wetting the second hydrophobic thin film in the second hydrophobic region; and
   drying the second organic solution to form a second organic thin film pattern, wherein the second organic thin film pattern has a hemispherical shape,
   wherein the first hydrophobic thin film is dissolved and removed when forming the second hydrophobic thin film.

2. The method of claim 1, wherein
the thickness of the first hydrophobic thin film and that of the second hydrophobic thin film are less than about 400 nm.

3. The method of claim 2, wherein
the thickness of the first hydrophobic thin film and that of the second hydrophobic thin film are more than about 10 nm.

4. The method of claim 1, wherein
the first organic thin film pattern and the second organic thin film pattern are alternately disposed.

5. The method of claim 1, wherein
the forming of the first hydrophobic thin film comprises coating a fluorine-containing polymer solution on the substrate, and
the forming of the first hydrophilic region comprises partially removing the fluorine from the first hydrophobic thin film.

6. The method of claim 5, wherein
the forming of the second hydrophobic thin film comprises coating a fluorine-containing polymer solution on the first organic thin film pattern and the substrate, and
the forming of the second hydrophilic region comprises partially removing the fluorine from the second hydrophobic thin film.

7. The method of claim 6, wherein
the removal of the fluorine from the first hydrophobic thin film and the second hydrophobic thin film comprises aligning a mask on the first hydrophobic thin film or the second hydrophobic thin film and irradiating optical energy thereto.

8. The method of claim 6, further comprising
removing the second hydrophobic thin film after forming the second organic thin film pattern.

9. The method of claim 1, wherein
the thickness of the second hydrophobic thin film is less than about 100 nm, and
the second organic solution is selectively wetted to overlap the first organic thin film pattern.

10. The method of claim 1, wherein
the first organic thin film pattern and the second organic thin film pattern comprise a curable polymer material including dispersed pigments.

11. The method of claim 1, wherein
the first organic thin film pattern and the second organic thin film pattern comprise a conjugated polymer.

12. The method of claim 1, wherein
the first organic thin film pattern and the second organic thin film pattern have a convex shape.

13. The method of claim 1, wherein
the first organic thin film pattern and the second organic thin film pattern have a flat surface at a central portion thereof.

14. A method for forming a pattern array, the method comprising:
- forming a first hydrophobic thin film;
- removing a portion of the first hydrophobic thin film to form a first hydrophilic region and a first hydrophobic region;
- coating a first organic solution on the surface of the substrate including on the first hydrophilic region and the first hydrophobic region;
- forming a first organic thin film pattern of the first organic solution in the first hydrophilic region without wetting the first hydrophobic thin film in the first hydrophobic region, wherein the first organic thin film pattern has a hemispherical shape;
- forming a second hydrophobic thin film on the first organic thin film pattern and removing the first hydrophobic thin film, the second hydrophobic thin film covering side surfaces and a top surface of the first organic thin film pattern;
- removing a portion of the second hydrophobic thin film to form the second hydrophilic region and a second hydrophobic region;
- coating a second organic solution on the surface of the substrate including on the second hydrophilic region and the second hydrophobic region; and
- forming a second organic thin film pattern of the second organic solution in the second hydrophilic region, wherein the second organic thin film pattern has a hemispherical shape,
- wherein the first hydrophobic thin film is dissolved and removed when forming the second hydrophobic thin film.

15. The method of claim 14, wherein
the first organic thin film pattern and the second organic thin film pattern are formed by using wettability of an organic solution.

16. The method of claim 15, wherein
the thickness of the second hydrophobic thin film is more than about 10 nm.

17. The method of claim 16, wherein
at least one of removing the first hydrophobic thin film and removing the second hydrophobic thin film includes aligning a mask on the first hydrophobic thin film or the second hydrophobic thin film and irradiating optical energy thereto.

18. The method of claim 15, wherein
the thickness of the second hydrophobic thin film is less than about 100 nm, and
the second organic solution is selectively wetted to overlap the first organic thin film pattern.

* * * * *